(12) United States Patent
Kim

(10) Patent No.: US 8,535,545 B2
(45) Date of Patent: Sep. 17, 2013

(54) METHOD FOR FABRICATING PELLICLE OF EUV MASK

(75) Inventor: Yong Dae Kim, Chungcheongnam-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 539 days.

(21) Appl. No.: 12/837,863

(22) Filed: Jul. 16, 2010

(65) Prior Publication Data
US 2011/0065278 A1 Mar. 17, 2011

(30) Foreign Application Priority Data
Sep. 14, 2009 (KR) .................. 10-2009-0086640

(51) Int. Cl.
*B44C 1/22* (2006.01)
(52) U.S. Cl.
USPC .............. 216/12; 428/14; 430/5; 430/15
(58) Field of Classification Search
None
See application file for complete search history.

(56) References Cited

U.S. PATENT DOCUMENTS

| | | | | |
|---|---|---|---|---|
| 6,623,893 | B1 * | 9/2003 | Lyons et al. | 430/5 |
| 2005/0042153 | A1 | 2/2005 | Bristol et al. | |
| 2008/0158535 | A1 * | 7/2008 | Goldstein et al. | 355/67 |
| 2009/0104544 | A1 * | 4/2009 | Kubota et al. | 430/5 |
| 2009/0291372 | A1 * | 11/2009 | Kubota et al. | 430/5 |
| 2012/0045714 | A1 * | 2/2012 | Akiyama et al. | 430/5 |

OTHER PUBLICATIONS

Juna, C.H., Gentile, C., Prinski, C. Sethian, J., Design and Numerical Stress Analysis of Silicon Membrane Hibachi Windows, 2005, Fusion Engineering 2005, E-ISBN: 0-4244-0150-X, Print ISBN: 0-4244-0150-X, (four pages total).*

* cited by examiner

*Primary Examiner* — Binh X Tran
*Assistant Examiner* — David Cathey, Jr.
(74) *Attorney, Agent, or Firm* — Ladas & Parry LLP

(57) ABSTRACT

A method for fabricating a pellicle of an EUV mask is provided. An insulation layer is formed over a silicon substrate, and a mesh is formed over the insulation layer. A frame exposing a rear surface of the insulation layer is formed by selectively removing a center portion of a rear surface of the silicon substrate. A membrane layer is deposited over the mesh and an exposed top surface of the insulation layer which is adjacent to the mesh. A rear surface of the membrane layer is exposed by selectively removing the portion of the insulation layer which is exposed by the frame.

8 Claims, 4 Drawing Sheets

METHOD FOR FABRICATING PELLICLE OF EUV MASK

CROSS-REFERENCES TO RELATED APPLICATIONS

The present application claims priority under 35 U.S.C 119(a) to Korean application number 10-2009-0086640, filed on Sep. 14, 2009, in the Korean intellectual property Office, which is incorporated herein by reference in its entirety set forth in full.

BACKGROUND

Exemplary embodiments of the present invention relate to an extreme ultraviolet lithography technology, and more particularly, to a method for fabricating a pellicle which protects an extreme ultraviolet (EUV) mask from particles.

As circuit critical dimensions (CD) of semiconductor devices have become more and more reduced, physical limitations in using ArF exposure apparatuses to achieve the requisite resolution needed in transferring fine patterns onto wafers have been reached. Accordingly, EUV lithography technology has been developed in order to transfer finer patterns onto wafers. The EUV lithograph technology is considered as a next generation technology which will be used to fabricate a slimmer and faster microchip having a critical dimension of 32 nm or less by using EUV light having about 13.5 nm exposure light wavelength.

Since EUV lithography technology uses light having a very short wavelength, a mask in which circuit patterns to be transferred onto a wafer are preferably provided in mask patterns that do not have light-transmission type structures but rather preferably have light-reflection type structures. Mask used in the EUV lithography processes are likely to include light reflection layers with a multilayer structure of Mo/Si layers on a substrate having a low thermal expansion coefficient (LTE), such as quartz, and a light absorption pattern formed on the light reflection layer that partially expose the surface of the light reflection layer.

A pellicle is often provided in order to protect the surface of the EUV mask used in the EUV lithography process from contamination sources such as particles. However, fabrication of such a pellicle that satisfies the demands of EUV lithography is difficult because, among other reasons, it is difficult to use polymers to fabricate a suitable pellicle membrane. In particular, it is well known that carbon-fluorine (C—F) based polymers absorb EUV light, and therefore it is practically difficult to use C—F based polymers as pellicle membranes. Thus, materials having high transmissivity with respect to the EUV light has been suggested as suitable candidates for pellicle membranes. For example, the following pellicle fabricating method may be employed. A mesh of a metal wire such as nickel (Ni) is formed by electroplating, and the mesh is mounted on a polymer film. Silicon (Si) is then deposited to form a silicon membrane layer. Subsequently, the polymer film is removed which results in the silicon membrane layer remaining attached to the mesh.

However since this type of pellicle fabricating method uses a polymer film as a sacrificial layer, then bubbles generated during the coating of the polymer film may arise and can result in causing defects on the silicon membrane layer which is subsequently deposited on the polymer film. Such defects may serve as factors that cause exposure defects during the EUV exposure process. Moreover, an alternate wet etch process may be performed by using organic components of the polymer during the process of removing the polymer film, however the resultant surface of the silicon membrane layer may be damaged during the wet etch process. This is accompanied by the defects on the silicon membrane. Therefore it is difficult to fabricate suitably pellicles that satisfy the demands of high resolution lithography that uses EUV.

SUMMARY

In one embodiment, a method for fabricating a pellicle includes: forming an insulation layer over a silicon substrate; forming a mesh over the insulation layer; forming a frame exposing a rear surface of the insulation layer by selectively removing a center portion of a rear surface of the silicon substrate; depositing a membrane layer over the mesh and an exposed top surface of the insulation layer which is adjacent to the mesh; and exposing a rear surface of the membrane layer by selectively removing the portion of the insulation layer which is exposed by the frame.

In one embodiment, a method for fabricating a pellicle includes: preparing a silicon on insulator (SOI) substrate in which an insulation layer is disposed a silicon body; forming a mesh including a silicon layer over the insulation layer; forming a frame exposing a rear surface of the insulation layer by selectively removing a center portion of a rear surface of the silicon substrate; depositing a membrane layer over the mesh and an exposed top surface of the insulation layer which is adjacent to the mesh; and exposing a rear surface of the membrane layer by selectively removing the portion of the insulation layer which is exposed by the frame.

In another embodiment, a method for fabricating a pellicle includes: forming a silicon oxide layer over a silicon substrate; forming a mesh layer over the silicon oxide layer; forming a mesh by selectively etching the mesh layer; forming a passivation layer covering the mesh and an exposed portion of the silicon oxide layer which is adjacent to the mesh; forming an etch mask over a rear surface of the silicon substrate which is opposite to the passivation layer, the etch mask exposing a center portion of the silicon substrate; forming a frame by selectively removing the center portion of the silicon substrate which is exposed by the etch mask; selectively removing the passivation layer; depositing a silicon membrane layer over the mesh and the exposed portion of the insulation layer which is adjacent to the mesh; and exposing a rear surface of the silicon membrane layer by selectively removing the portion of the silicon oxide layer which is exposed by the frame.

The insulation layer may include a silicon oxide layer.

The exposing of the rear surface of the membrane layer may include performing a selective dry etch process on the portion of the silicon oxide layer which is exposed by the frame.

The forming of the mesh may include: depositing a silicon (Si) layer as a mesh layer over the insulation layer; and forming the mesh by selectively etching the silicon layer.

The forming of the frame may include: forming a passivation layer covering the mesh and the exposed portion of the insulation layer which is adjacent to the mesh; forming an etch mask over the rear surface of the silicon substrate which is opposite to the passivation layer, the etch mask exposing the center portion of the rear surface of the silicon substrate; selectively dry etching the center portion of the silicon substrate which is exposed by the etch mask; and selectively removing the passivation layer.

The passivation layer may include a silicon nitride layer.

The forming of the membrane layer may include depositing a silicon layer over the mesh.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, specific embodiments of the present invention will be described with reference to the accompanying drawings. The drawings are not necessarily to scale and in some instances, proportions may have been exaggerated in order to clearly depict certain features of the invention.

FIGS. 1 to 8 illustrate a method for fabricating a pellicle of an EUV mask according to an embodiment of the present invention.

Figure 1:
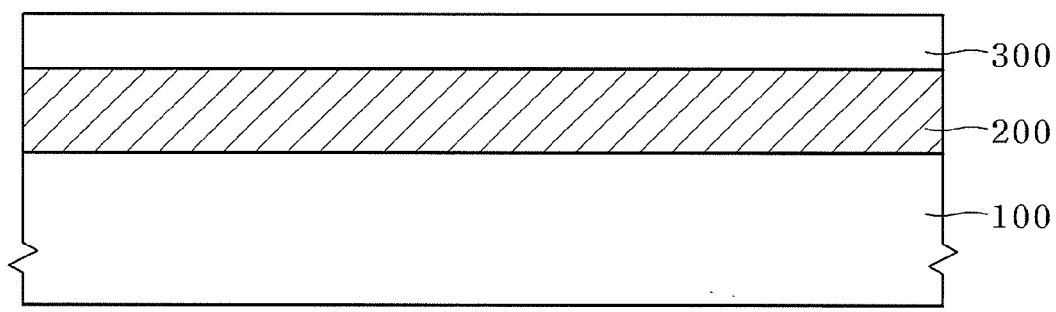
FIGS. 1 to 8 illustrate a method for fabricating a pellicle of an EUV mask according to an embodiment of the present invention

Referring to FIG. 1, a method for fabricating a pellicle of an EUV mask according to an embodiment of the present invention may be performed by using a substrate having a silicon on insulator (SOI) structure. For example, the SOI structure is provided by forming a silicon oxide ($SiO_2$) insulation layer 200 over a silicon substrate 100 and forming a silicon mesh layer 300 over the insulation layer 200. The mesh layer 300 is a layer for a mesh serving to support a membrane layer. The mesh layer 300 may be formed by epitaxially growing a silicon layer over the silicon oxide layer provided as the insulation layer 200.

Figure 2:
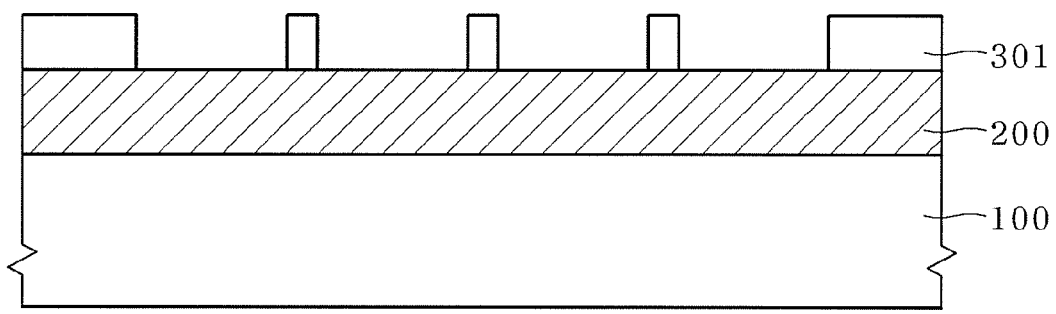
Figure 3:
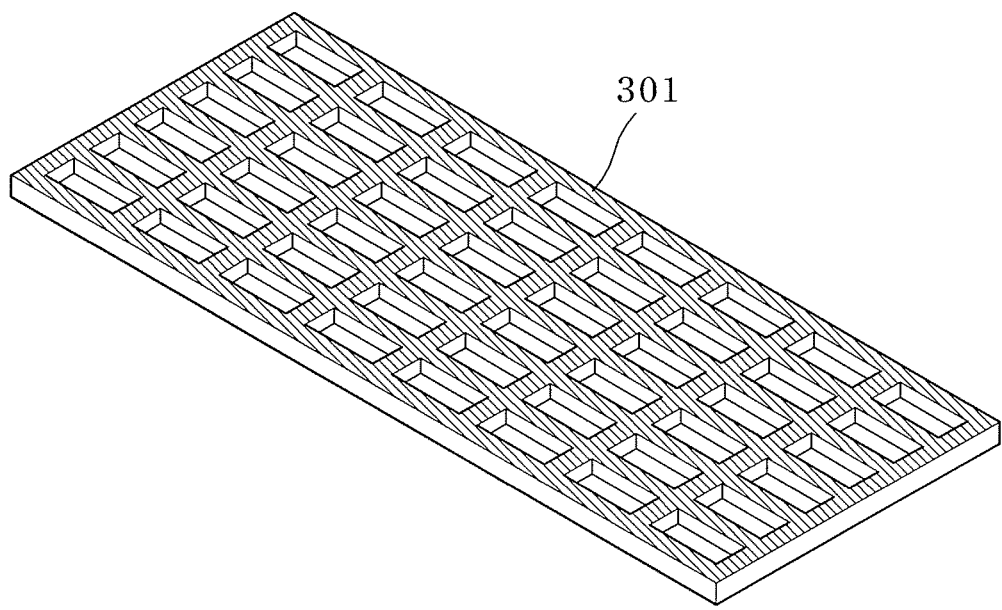

Referring to FIGS. 2 and 3, a mesh 301 is formed by patterning the mesh layer 300. As illustrated in FIG. 3, the mesh 301 is formed in mesh-shaped patterns, in which openings are arranged, by selectively etching the mesh layer 300 by using a deep reactive ion etch process. The openings of the mesh 301 provide paths through which EUV exposure light passes during the EUV exposure process. The mesh 301 is provided to support the membrane layer which is formed having a very small thickness. Since the mesh 301 is formed in silicon patterns as opposed to a nickel (Ni) mesh, it can provide an etch selectivity during the process of selectively etching the insulation layer 200 which is formed under the mesh 301 and used as a sacrificial layer during a subsequent process. Moreover, since a dry etch process such as reactive ion etch (RIE) process developed in the course of the semiconductor fabrication may be used during the formation of the mesh 301, it is possible to utilize a developed semiconductor fabrication apparatus.

Figure 4:
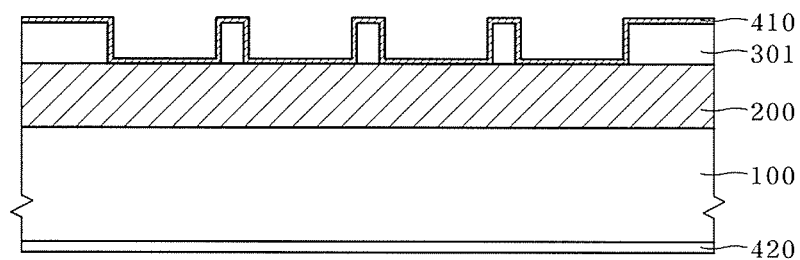

Referring to FIG. 4, a passivation layer 410 is formed which extends to cover the patterns of the mesh 301 and the surface of the insulation layer 200 which is exposed by the formation of the mesh 301. In addition, a layer 420 for etch mask is formed on a rear surface opposite to a front surface on which the mesh 301 is formed, that is, a rear surface of the silicon substrate 100. The layer 420 for etch mask is formed so that it provides an etch mask to be used in an etch process that selectively removes a center portion of the silicon substrate 100 and leaves an edge portion of the silicon substrate 100 as a frame. Therefore, the layer 420 for etch mask may be formed to include an insulation layer (for example, a silicon nitride ($Si_3N_4$) layer) having an etch selectivity with respect to silicon of the silicon substrate 100. The passivation layer 410 is provided to protect the shape of the mesh 301 during the selective etch process. To this end, the layer 420 for etch mask may be formed to include an insulation layer (for example, a silicon nitride ($Si_3N_4$) layer) having an etch selectivity with respect to silicon of the silicon substrate 100.

Figure 5:
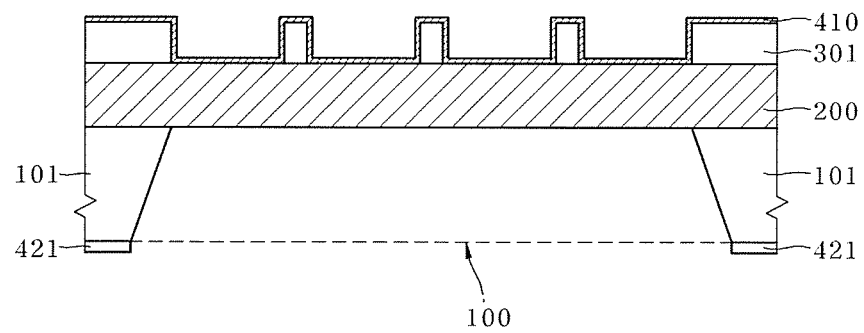

Referring to FIG. 5, an etch mask 421 which opens the center portion of the silicon substrate 100, for example, a chip region on which EUV exposure light is incident, is formed by patterning the layer 420 for etch mask. The surface of the insulation layer 200 is exposed by selectively dry etching a portion of the silicon substrate 100 which is exposed by the etch mask. Due to the dry etch process, the edge portion of the silicon substrate 100 which covers only the edge portion of the insulation layer 200 remains which thereby forms the frame 101. The frame 101 may serve to support the mesh 301 and may serve as a support to make the pellicle supported to the EUV mask when the pellicle and the EUV mask are attached together.

Figure 6:
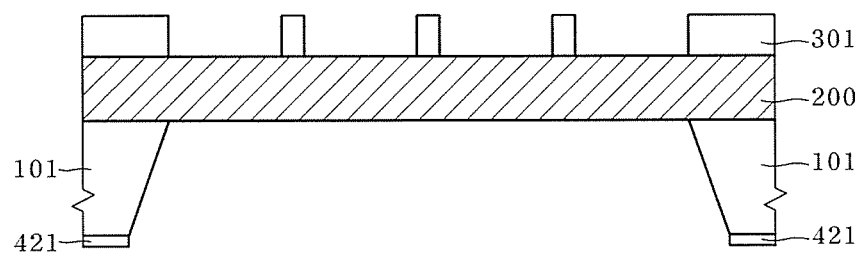

Referring to FIG. 6, the passivation layer (410 in FIG. 5) which protects the mesh 301 during the dry etch process for forming the frame 101 is selectively removed. The removing process may be performed by a process of stripping a silicon nitride layer which constitutes the passivation layer 410.

Figure 7:
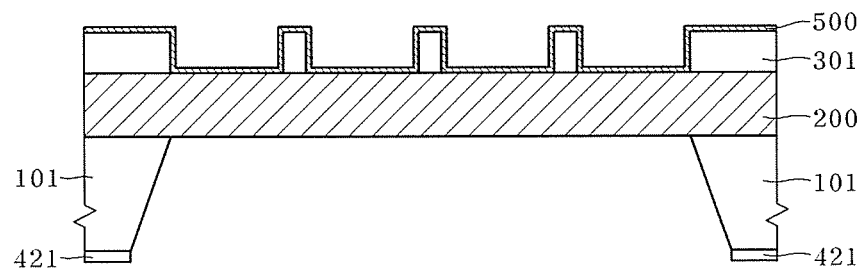

Referring to FIG. 7, a membrane layer 500 is formed to cover the mesh 301 which is exposed by stripping the passivation layer 410 and the front surface of the insulation layer 200 which is adjacent to the mesh 301. The membrane layer 500 may be formed by depositing a silicon layer. The silicon layer is a layer which maintains a permittivity with respect to EUV light at a very high level even at a thickness of about 200 nm, as compared with silicon oxide, aluminum, gold, or nickel. As a result, the silicon layer has a significantly suitable permittivity characteristic with respect to the membrane layer 500 of the pellicle. In the deposition of the silicon layer, an underlying layer is the silicon layer constituting the mesh 301 or the silicon oxide layer constituting the insulation layer 200. Therefore, the mesh 301 or the insulation layer 200, which are the underlying layer, is in such a state that a defect generation factor due to bubbles caused by the coating is suppressed, as opposed to a polymer film. Hence, it is possible to suppress the generation of defects in the silicon membrane layer 500.

Figure 8:
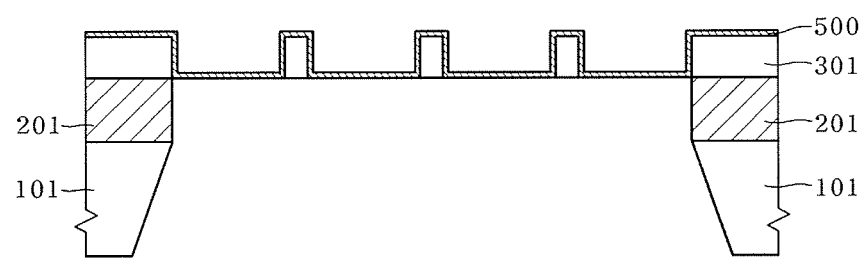

Referring to FIG. 8, the rear surface of the membrane layer 500 is also exposed by removing the portion of the insulation layer 200, which is exposed by the frame 101, by using a selective dry etch process. In this case, since the insulation layer 200 is formed of silicon oxide, it may be removed by a dry etch process having an etch selectivity with respect to silicon constituting the frame 101 or silicon constituting the membrane layer 500. The dry etch process may be performed by using carbon fluoride ($CF_x$) gas as an etch gas. As a result of the anisotropic dry etching, the portion of the insulation layer 200 that overlaps with the frame 101 remains as the insulation pattern 201. The frame 101 serves as a practical etch mask during the dry etch process, and the remaining etch mask (421 in FIG. 7) may also serve as an etch mask.

In the method for fabricating the pellicle of the EUV mask according to the embodiment of the present invention, the silicon oxide insulation layer 200 is used instead of the polymer-based insulation layer as the sacrificial layer for forming the silicon membrane layer 500. Therefore, it is possible to suppress the defects from being generated in the membrane layer caused by bubbles generated during the coating of the polymer. Thus, it is possible to substantially prevent the defects from being generated in the membrane layer 500. Furthermore, by removing the insulation layer 200 serving as the sacrificial layer through the dry etch process, it is also possible to effectively suppress defects or damage of the silicon membrane layer 500 by using a significant etch selectivity between silicon oxide of the insulation layer 200 and silicon of the membrane layer 500. By fabricating the pellicle with the use of the silicon substrate 100, the semiconductor fabrication apparatus can be utilized during the fabrication process and thus mass production of the pellicle can be achieved more easily.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. A method for fabricating a pellicle, comprising:
   forming an insulation layer over a silicon substrate;
   forming a mesh over the insulation layer;
   removing selectively a center portion of a rear surface of the silicon substrate to form a frame that exposes a rear surface of the insulation layer;
   depositing a membrane layer over the mesh and over an exposed top surface of the insulation layer which is adjacent to the mesh; and
   removing selectively the portion of the insulation layer which is exposed by the frame to expose a rear surface of the membrane layer.

2. The method of claim 1, wherein the insulation layer comprises a silicon oxide layer.

3. The method of claim 2, wherein exposing the rear surface of the membrane layer comprises performing a selective dry etch process on the portion of the silicon oxide layer which is exposed by the frame.

4. The method of claim 1, wherein forming the mesh comprises:
   depositing a silicon (Si) layer as a mesh layer over the insulation layer; and
   etching selectively the deposited silicon layer to form the mesh.

5. The method of claim 1, wherein forming the frame comprises:
   forming a passivation layer covering the mesh and covering the exposed portion of the insulation layer which is adjacent to the mesh;
   forming an etch mask over the rear surface of the silicon substrate which is opposite to the passivation layer such that the etch mask exposes the center portion of the rear surface of the silicon substrate;
   selectively dry etching the center portion of the silicon substrate which is exposed by the etch mask; and
   selectively removing the passivation layer.

6. The method of claim 5, wherein the passivation layer comprises a silicon nitride layer.

7. The method of claim 5, wherein forming the etch mask comprises:
   forming a silicon nitride layer covering the rear surface of the silicon substrate; and
   selectively etching the silicon nitride layer.

8. The method of claim 5, wherein depositing the membrane layer comprises depositing a silicon layer over the mesh.

* * * * *